(12) United States Patent  (10) Patent No.: US 7,314,688 B2
Shoki  (45) Date of Patent: Jan. 1, 2008

(54) METHOD OF PRODUCING A REFLECTION MASK BLANK, METHOD OF PRODUCING A REFLECTION MASK, AND METHOD OF PRODUCING A SEMICONDUCTOR DEVICE

(75) Inventor: Tsutomu Shoki, Tokyo (JP)

(73) Assignee: Hoya Corporation, Tokyo (JP)

( * ) Notice: Subject to any disclaimer, the term of this patent is extended or adjusted under 35 U.S.C. 154(b) by 295 days.

(21) Appl. No.: 10/658,372

(22) Filed: Sep. 10, 2003

(65) Prior Publication Data

US 2004/0224526 A1 Nov. 11, 2004

(30) Foreign Application Priority Data

Sep. 11, 2002 (JP) ............................ 2002-265044

(51) Int. Cl.
G03F 1/00 (2006.01)
G03F 7/20 (2006.01)
C23C 14/34 (2006.01)
C22F 1/00 (2006.01)
C23G 1/02 (2006.01)

(52) U.S. Cl. ............................. 430/5; 430/311; 430/4; 204/192.11; 204/192.27; 204/192.28; 148/713; 134/3

(58) Field of Classification Search ............... 430/5, 430/311, 4; 204/192.11
See application file for complete search history.

(56) References Cited

U.S. PATENT DOCUMENTS

| | | | |
|---|---|---|---|
| 5,958,627 A * | 9/1999 | Shoki | 430/5 |
| 6,048,652 A * | 4/2000 | Nguyen et al. | 430/5 |
| 6,319,635 B1 * | 11/2001 | Mirkarimi et al. | 430/5 |
| 6,396,900 B1 * | 5/2002 | Barbee et al. | 378/84 |
| 6,596,465 B1 * | 7/2003 | Mangat et al. | 430/311 |
| 7,056,627 B2 * | 6/2006 | Shoki et al. | 430/5 |
| 2001/0019803 A1 * | 9/2001 | Mirkanimi | 430/5 |
| 2003/0152845 A1 * | 8/2003 | Kumada et al. | 430/5 |

FOREIGN PATENT DOCUMENTS

| | | |
|---|---|---|
| JP | 7-283116 A | 10/1995 |
| JP | 2001-291661 A | 10/2001 |
| JP | 2002-246299 A | 8/2002 |

OTHER PUBLICATIONS

Levinson, Harry J., Principles of Lithography, 2001, SPIE—The International Society for Optical Engineering, p. 343.*

* cited by examiner

Primary Examiner—Mark F. Huff
Assistant Examiner—John Ruggles
(74) Attorney, Agent, or Firm—Sughrue Mion, PLLC

(57) ABSTRACT

A reflection mask blank and a method of producing a reflection mask blank by forming, on a substrate, at least a multilayer reflection film for reflecting exposure light and an absorber layer formed on the multilayer reflection film for absorbing the exposure light. In order to avoid change over lapsed time in properties of the multilayer reflection film, the substrate with the multilayer reflection film is subjected to heat treatment. The heat treatment is during deposition and/or after deposition of the multilayer reflection film. A reflection mask is made from the reflection mask blank according to a reflection mask production method and a semiconductor is made from the reflection mask according to a semiconductor production method.

7 Claims, 4 Drawing Sheets

METHOD OF PRODUCING A REFLECTION MASK BLANK, METHOD OF PRODUCING A REFLECTION MASK, AND METHOD OF PRODUCING A SEMICONDUCTOR DEVICE

This application claims priority to prior Japanese application JP 2002-265044, the disclosure of which is incorporated herein by reference.

BACKGROUND OF THE INVENTION

This invention relates to methods of producing a reflection type mask blank and a reflection type mask for exposure for use in semiconductor pattern transfer and the like, and a method of producing a semiconductor device.

Recently, in the semiconductor industry, an EUV lithography, which is an exposure technique using extreme ultra violet (Extreme Ultra Violet, EUV) light, appears promising following the miniaturization of a semiconductor device. It is noted here that the EUV light means light of a wavelength band within a soft X-ray region or a vacuum ultraviolet region, specifically, light having a wavelength of about 0.2-100 nm. As a mask used in the EUV lithography, proposal is made of a reflection type mask as disclosed in JP-A No. H8-213303.

The reflection type mask mentioned above has a structure comprising a multilayer reflection film formed on a substrate for reflecting the EUV light and an absorber layer formed as a pattern on the multilayer reflection film for absorbing the EUV light. In an exposure apparatus (pattern transfer apparatus) to which the reflection type mask mentioned above is mounted, exposure light incident to the reflection type mask is absorbed at a part where the absorber layer pattern is present and is reflected by the multilayer reflection film at another part where the absorber layer pattern is not present to form an optical image which is transferred through a reflection optical system onto a semiconductor substrate (a silicon wafer with a resist).

As the multilayer reflection film mentioned above, use is generally made of a multilayer film in which a material having a relatively high refractive index and a material having a relatively low refractive index are alternately laminated by the thickness on the order of several nanometers. For example, a multilayer film obtained by alternately laminating Si films and Mo films is known as a film having high reflectance for the EUV light of 13-14 nm. In the reflection type mask using the multilayer reflection film mentioned above, the film density of each layer of the multilayer film must be increased in order to obtain high reflectance with respect to light having a short wavelength. As a consequence, the multilayer reflective film inevitably has a high compression stress.

According to the study of the present inventor, however, it has been found out that, after the multilayer reflection film is deposited, the stress of the film is changed with the lapse of time by about 30 MPa in a tensile direction due to thermal factors, even if the film is used or stored in a normal environment. Such change in stress intermittently occurs, for example, in a period of one year.

It has been found out that, in a production process of a reflection type mask blank after deposition of the multilayer reflection film, the change in stress of the multilayer reflection film also occurs due to thermal factors in a cleaning step, a baking step after deposition of a resist film, and the like.

Presumably, the change in stress results from very slight mixing at an interface between respective layers forming the multilayer reflection film. Such change is of a level which can not be detected by measurement of a period length by the X-ray diffraction analysis but causes the peak wavelength of the reflectance of the multilayer reflection film (i.e., the wavelength at which the reflectance of the multilayer reflection film has a peak value (maximum value)) to be changed by the level of 0.01 nm. Since the EUV light has a very short wavelength, the change in state of the multilayer reflection film very sensitively affect the wavelength characteristic and the reflection characteristic thereof.

In the EUV lithography, the light in a specific narrow wavelength band is used so that the influence of wavelength shift is great. The shift in peak wavelength of the reflectance causes mismatching with a mirror of the exposure apparatus used upon pattern transfer. Therefore, the peak wavelength must accurately be controlled. Furthermore, the shift in peak wavelength causes a decrease in reflectance of the multilayer reflection film. Thus, the change with time in stress of the multilayer reflection film poses various problems in practical use of the mask, for example, causes the change in flatness of a substrate.

In existing reflection type masks, however, no consideration has been made of the above-mentioned problems due to the change with time in stress of the multilayer reflection film after the multilayer reflection film is formed and no means for solving the problems has been found out.

SUMMARY OF THE INVENTION

This invention has been made against the above-mentioned background and an object of this invention is to provide methods of producing a reflection type mask blank and a reflection type mask which is suppressed in change with time in stress of a multilayer reflection film after the film is formed and which can stably be used in practical use.

With respect to the above-mentioned object, the present inventor earnestly studied the problems and sought their solutions. As a result, it has been found out that, by heat-treating a multilayer reflection film formed on a substrate, the change with time in stress of the multilayer reflection film can be suppressed without causing the a decrease in reflectance of the multilayer reflection film.

According to this invention, there is provided a method of producing a reflection type mask blank by forming, on a substrate, at least a multilayer reflection film for reflecting exposure light and an absorber layer formed on the multilayer reflection film for absorbing the exposure light, wherein, in order to avoid mixing at an interface between respective layers forming the multilayer reflection film due to thermal factors after deposition of the multilayer reflection film, the substrate with the multilayer reflection film is subjected to heat treatment during deposition and/or after deposition of the multilayer reflection film so as to suppress the progress of the mixing at the interface between the respective layers. This makes it possible to suppress the change with time in stress of the multilayer reflection film after deposition of the multilayer reflection film. This makes it possible to prevent the changes in wavelength characteristic and reflection characteristic of the multilayer reflection film with respect to EUV light as exposure light.

Preferably, the heat treatment is carried out before a resist film is formed on the absorber layer. More preferably, the heat treatment is carried out before the absorber layer is formed. This is because the reflectance of the multilayer reflection film can not be measured after the resist film or the absorber layer is formed.

In this invention, a substrate heating temperature in the above-mentioned heat treatment is preferably not lower than 50° C. and not higher than a baking temperature of the resist film. This is because, in a production process of the reflection type mask blank, the heat treatment at a high temperature higher than the baking temperature of the resist film results in decrease in reflectance of the multilayer reflection film and substantial shift in peak wavelength. Furthermore, in order to achieve the effect of sufficiently suppressing the change with time in stress, the heat treatment at a temperature not lower than a predetermined level (not lower than 50° C.) is required. The temperature is preferably not lower than 50° C. and not higher than 135° C., not lower than 50° C. and not higher than 100° C., more preferably not lower than 60° C. and not higher than 100° C.

In this invention, it is preferable that the resist film is a chemically amplified resist.

This is because the chemically amplified resist has a high resolution and allows the baking temperature of the resist film to be a relatively low temperature so that the decrease in reflectance of the multilayer reflection film and the shift in peak wavelength due to the heat treatment can be minimized.

The heat treatment in this invention can be carried out in any state as far as a required temperature is obtained. For example, the heat treatment may be carried out by keeping the multilayer reflection film formed on the substrate in contact with a liquid held in a heated state. For example, if the substrate is dipped into a cleaning liquid held in a heated state so as to be kept in contact therewith for a predetermined time period, the heat treatment in this invention can be carried out simultaneously with cleaning without adding a new step.

As the multilayer reflection film, use is made of, for example, a multilayer film obtained by alternately laminating molybdenum thin films and silicon thin films. This multilayer reflection film has a high reflectance for the EUV light of 13-14 nm and a high compressive stress. By carrying out the heat treatment of this invention, the change with time in stress of the film can be suppressed.

By forming a pattern in the absorber layer of the reflection type mask blank produced by the above-mentioned method of this invention, a reflection type mask can be obtained. According to this invention, it is possible to provide a reflection type mask which is suppressed in change with time in stress of the multilayer reflection film and which can stably be used in practical use.

DESCRIPTION OF THE PREFERRED EMBODIMENTS

Figure 1A:
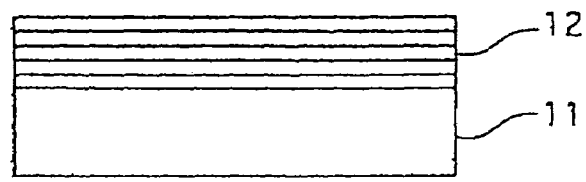
FIGS. 1A-D are sectional views schematically showing a production process of a reflection type mask blank and a reflection type mask according to this invention.

Now, description will be made of an embodiment of this invention.

In this invention, a unit Rms representative of the smoothness is a root-mean-square roughness and can be measured by the use of an atomic force microscope. The flatness in this invention is a value indicating surface warp (deformation) given by TIR (Total Indicated Reading). This value is an absolute value of a difference in level between a highest position on a substrate surface above a focal plane and a lowest position below the focal plane where the focal plane is a plane determined by the least square method with reference to the substrate surface.

A reflection type mask blank produced by the method of this invention comprises a multilayer reflection film formed on a substrate for reflecting EUV light as exposure light and an absorber layer formed on the multilayer reflection film for absorbing the EUV light as the exposure light. In necessary, a buffer layer which is resistant against an etching environment upon formation of a pattern on the absorber layer and thus serves to protect the multilayer reflection film may be provided between the multilayer reflection film and the absorber layer. A reflection type mask produced in the method of this invention is obtained by forming the pattern in the absorber layer of the reflection type mask blank.

Description will be made of the method of producing a reflection type mask blank according to this invention in conjunction with a case including the buffer layer by way of example.

At first, a substrate is prepared and a multilayer reflection film is formed on the substrate. The substrate with the multilayer reflection film formed thereon is heat-treated at a substrate heating temperature not lower than 50° C. and not higher than a baking temperature of a resist film so as to avoid the progress of mixing at an interface between respective layers forming the multilayer reflection film due to thermal factors after deposition of the multilayer reflection film.

After the heat treatment, a buffer layer and an absorber layer are successively formed on the multilayer reflection film. Thus, the reflection type mask blank according to this embodiment is obtained.

Next, each production step will be described.

At first, preparation of the substrate will be described.

As the substrate used in this invention, it is preferable to use a substrate having a low coefficient of thermal expansion within a range of $0 \pm 1.0 \times 10^{-7}$/° C., more preferably within a range of $0 \pm 0.3 \times 10^{-7}$/° C., in order to avoid distortion of the pattern due to heat during exposure. As a material having such a low coefficient of thermal expansion within the above-mentioned range, any one of an amorphous glass, a ceramic, and a metal may be used. For example, use may be made of $SiO_2$—$TiO_2$ glass and quartz glass as the amorphous glass. As the crystallized glass, crystallized glass with β-quartz solid solution deposited therein may be used. As the metal, Invar alloy (Fe—Ni alloy) or the like may be used.

In order to achieve high reflectance and high transfer accuracy, a substrate having high smoothness and high flatness is preferable. In particular, the substrate preferably has the roughness of 0.2 nmRms or less (roughness in an area of 10 μm square) and the flatness of 100 nm or less (flatness in an area of 142 mm square).

The substrate preferably has high rigidity in order to prevent deformation due to the film stress of a film to be formed thereon. In particular, the substrate preferably has a high Young's modulus not lower than 65 GPa. Taking the above into consideration, the substrate is selected and prepared.

Next, formation of the multilayer reflection film will be described.

The multilayer reflection film in this invention has a structure in which materials different in refractive index are periodically laminated and is adapted to reflect light having a specific wavelength. For example, for the exposure light (EUV light) having a wavelength of about 13 nm, use is generally made of a multilayer reflection film comprising about 40 periods of alternate layers of Mo and Si. In case of the Mo/Si multilayer reflection film, a layer having a relatively large refractive index is Mo while a layer having a relatively small refractive index (the refractive index being nearer to 1) is Si. The materials forming the multilayer reflection film may appropriately be selected in dependence upon the wavelength of the exposure light to be used. As other examples of the multilayer reflection film used in a region of the EUV light, use may be made of an Ru/Si periodic multilayer reflection film, an Mo/Be periodic multilayer reflection film, an Mo-compound/Si-compound periodic multilayer reflection film, an Si/Nb periodic multilayer reflection film, an Si/Mo/Ru periodic multilayer reflection film, an Si/Mo/Ru/Mo periodic multilayer reflection film, and an Si/Ru/Mo/Ru periodic multilayer reflection film.

The multilayer reflection film may be formed on the substrate or on a stress correction film, for example, by DC magnetron sputtering. In case of the Mo/Si multilayer reflection film, 30-60 periods, preferably about 40 periods, are deposited in an Ar gas atmosphere by alternately using an Si target and an Mo target. Finally, another Si film is deposited. As another deposition method, IBD (ion Beam Deposition (may be referred to as ion beam sputtering) in which an ion beam is irradiated onto a multilayer reflection film deposition target to carry out deposition by ion beam sputtering) or the like.

Next, description will be made of the heat treatment of the multilayer reflection film.

It has been revealed that the heat treatment of the multilayer reflection film formed on the substrate assures the stability of stress of the multilayer reflection film over time.

As described above, the stress of the multilayer reflection film exhibits the change with time after deposition, even if it is used or stored in a normal environment. Also in a production process of the reflection type mask blank after deposition of the multilayer reflection film, the change in stress occurs due to thermal factors in a cleaning step, a baking step after deposition of a resist film, and the like.

Specifically, in a long period of time, the stress is gradually changed towards tensile stress and the peak wavelength is simultaneously shifted. In the production process of the reflection type mask blank after deposition of the multilayer reflection film, the stress is changed due to the thermal factors and the peak wavelength is simultaneously shifted. This results in a problem in practical use.

By the predetermined heat treatment of this invention, the stress of the multilayer reflection film is no longer changed from a time instant immediately thereafter. This is because, by preliminarily causing mixing at the interface between the respective layers of the multilayer reflection film due to thermal factors, subsequent progress of the mixing at the interface between the respective layers due to the thermal factors is suppressed. Therefore, by such heat treatment, it is possible to stabilize the stress of the multilayer reflection film after deposition and to prevent a trouble such as the change with time in peak wavelength of the multilayer reflection film during the use of the mask.

It is noted here that the heat treatment at an excessively high temperature results in decrease in reflectance of the multilayer reflection film or in substantial shift in peak wavelength. Therefore, in this invention, the heat treatment is preferably carried out in the manner such that the substrate with the multilayer reflection film is heated at the substrate heating temperature not higher than a pre-bake temperature of the resist film. This is because, in the production process of the reflection type mask blank, the baking temperature of the resist film is highest among the thermal factors occurring after deposition of the multilayer reflection film. As the resist film, a polymer resist, a chemically amplified resist, and the like are known. The baking temperature of those resist films falls within a range of about 120° C. to about 200° C. Among the above-mentioned resists, the chemically amplified resist has a high resolution and allows the baking temperature of the resist film to be relatively low (for example, not higher than 135° C.) so as to minimize the decrease in reflectance of the multilayer reflection film and the shift in peak wavelength due to the heat treatment. The temperature is preferably not higher than 135° C., more preferably not higher than 100° C.

In order to achieve the effect of sufficient stability of stress against the change with time, the temperature not lower than 50° C. is preferable. More preferably, the temperature is not lower than 60° C.

The heat treatment must be carried out for a time period sufficient to uniformly heat the multilayer reflection film. Generally, the heat treatment for 3 minutes or more provides the effect of stability of stress against the change with time. More preferably, the heat treatment is carried out for 5 minutes or more, if necessary, for 10 minutes or more. The heat treatment may be carried out any time after the multilayer reflection film is formed on the substrate, for example, after the buffer layer is formed, after the absorber layer is formed, or after the pattern is formed on the absorber layer. In view of reduction in influence upon other layers and control of measurement of the reflectance, the heat treatment is preferably carried out after the multilayer reflection film is formed on the substrate and before other layers such as the buffer layer and the absorber layer are formed.

The heat treatment may be carried out in any state as far as a required temperature is obtained. For example, the substrate is put into a heated atmosphere to be heated, placed on a hot heater to be heated, or kept in contact with a heated liquid (by dipping into the liquid or the like). Thus, the heat treatment may be carried out in various manners. A plasma atmosphere may be used. If the substrate is kept in contact with a cleaning liquid held at a heating temperature for a predetermined time period, the heat treatment can be carried out simultaneously with cleaning without adding a new step.

In this invention, the change with time in stress of the multilayer reflection film can be suppressed by subjecting the multilayer reflection film to the predetermined heat treatment. It is therefore possible to effectively prevent the problem such as the shift in peak wavelength of the multilayer reflection film due to the change with time in stress. Since high-temperature heat treatment is not carried out, it is possible to prevent the decrease in reflectance of the multilayer reflection film due to the heat treatment.

Next, formation of the buffer layer will be described.

The buffer layer has a function as an etch stopper layer for protecting, upon forming a transfer pattern on the absorber layer, the multilayer reflection film as a lower layer. Generally, the buffer layer is formed between the multilayer reflection film and the absorber layer. The buffer layer may be formed if necessary.

As a material of the buffer layer, a material having high etch selectivity to the absorber layer is selected. The etch selectivity between the buffer layer and the absorber layer is 5 or more, preferably 10 or more, more preferably 20 or more. Furthermore, a material low in stress and excellent in smoothness is preferable. Particularly, a material having a roughness of 0.3 nmRms or less is preferable. In view of the above, the material of the buffer layer preferably has a microcrystal structure or an amorphous structure.

Generally, Ta or a Ta alloy is often used as a material of the absorber layer. In case where a Ta-based material is used as the material of the absorber layer, the buffer layer is preferably made of a material containing Cr. For example, use may be made of elemental Cr or a material containing Cr and at least one of nitrogen, oxygen, and carbon added thereto. Specifically, chromium nitride (CrN) or the like may be used.

On the other hand, in case where elemental Cr or a material containing Cr is used as the absorber layer, the buffer layer may be made of a material containing Ta as a main component, for example, a material containing Ta and B or a material containing Ta, B, and N.

Upon forming the reflection type mask, the buffer layer is generally removed in a patterned shape in accordance with the pattern formed on the absorber layer in order to prevent the decrease in reflectance of the mask. However, if a material having a large transmittance for the EUV light as the exposure light is used as the buffer layer so that the thickness is sufficiently thin, the buffer layer may be left to cover the multilayer reflection film without being removed in a patterned shape.

For example, the buffer layer may be formed by sputtering such as DC sputtering, RF sputtering, and ion beam sputtering.

Next, formation of the absorber layer will be described.

As a material of the absorber layer in this invention, a material having a high absorbability at the exposure light and a sufficiently large etch selectivity to a layer positioned under the absorber layer (generally, the buffer layer or the multilayer reflection film) is selected. For example, a material containing Ta as a main metal component is preferable. In this case, if a material containing Cr as a main component is used as the buffer layer, the etch selectivity can be large (10 or more). Herein, the material containing Ta as a main metal element means that, among metal elements in the components, a metal having a greatest composition ratio is Ta. The material used as the absorber layer and containing Ta as a main metal element is generally a metal or an alloy. In view of the smoothness and the flatness, a material having an amorphous structure or a microcrystal structure is preferable. As the material containing Ta as a main metal element, use may be made of a material containing Ta and B, a material containing Ta and N, a material containing Ta, B, and O, a material containing Ta, B, and N, a material containing Ta and Si, a material containing Ta, Si, and N, a material containing Ta and Ge, a material containing Ta, Ge, and N, and so on. By addition of B, Si, Ge, or the like to Ta, an amorphous-like material is easily obtained and the smoothness is improved. On the other hand, if N or O is added to Ta, the resistance against oxidation is improved so as to achieve the effect of improving the stability over time.

As other materials of the absorber layer, use may be made of a material containing Cr as a main component (chromium, chromium nitride, and the like), a material containing tungsten as a main component (tungsten nitride and the like), a material containing titanium as a main component (titanium, titanium nitride) and the like.

The absorber layer may be formed by typical sputtering. In order to keep high profile CD (critical dimension) accuracy and high placement accuracy of the pattern after pattern formation, the absorber layer is preferably formed in the manner such that the stress is reduced.

In the above-mentioned manner, the reflection type mask blank of this embodiment is obtained.

The reflection type mask blank of this embodiment may have still another layer if necessary.

Next, description will be made of a method of producing a reflection type mask.

The reflection type mask can be produced by forming a pattern in absorber layer of the above-mentioned reflection type mask blank Formation of the pattern in the absorber layer is carried out in the following manner. By applying a resist for electron beam writing on the above-mentioned reflection type mask blank and baking the resist, a resist layer is formed. By electron beam writing and development, a resist pattern is formed. Then, using the resist pattern as a mask, the absorber layer is etched by a method such as dry etching. In case where the absorber layer is made of a material containing Ta as a main metal component, the pattern can be formed by dry etching using chlorine with the buffer layer serving as a protection layer for the multilayer reflection film. After the pattern of the absorber layer is formed, the resist layer left on the pattern of the absorber layer is removed. If necessary, the buffer layer is removed in a patterned shape in accordance with the pattern of the absorber layer. For example, in case where a film containing Cr as a main component is used as the buffer layer, the buffer layer can be removed by dry etching using a mixed gas of chlorine and oxygen.

In the above-mentioned manner, the reflection type mask is obtained.

In case where the resist is a chemically amplified resist, baking after electron beam writing (PEB: Post-Exposure Bake) is carried out in order to assure sufficient solubility to a liquid developer.

As described above, in the methods of producing a reflection type mask blank and a reflection type mask in this invention, the multilayer reflection film is subjected to the predetermined heat treatment so that the reflection type mask blank and the reflection type mask are obtained which are suppressed in change with time in stress of the multilayer reflection film due to thermal factors and are therefore prevented from the change with time such as the shift in peak wavelength of the reflectance and the decrease in reflectance and which can stably be used in practical use.

Next, this invention will be described more in detail in conjunction with examples.

The stress of the multilayer reflection film was calculated from the variation in flatness of the substrate before and after the deposition or after the heat treatment.

EXAMPLE 1

Referring to FIGS. 1A-D, description will be made of methods of producing an EUV reflection type mask blank 100 and an EUV reflection type mask 101 in this example. FIGS. 1A-D are sectional views schematically showing a production process of the EUV reflection type mask blank 100 and the EUV reflection type mask 101 in this example.

A substrate 11 is an $SiO_2$—$TiO_2$ glass substrate (outer dimension of 6 inch square, thickness of 6.3 mm). The substrate has a coefficient of thermal expansion of 0.2× $10^{-7}/°$ C. and a Young's modulus of 67 GPa. The glass substrate was subjected to mechanical polishing to have a roughness of 0.2 nmRms or less and a flatness of 100 nm or less.

At first, a multilayer reflection film 12 was formed on the substrate 11 (see FIG. 1A).

As the multilayer reflection film 12, an Mo/Si periodic multilayer reflection film was used in this example in order to form the multilayer reflection film adapted to an exposure light wavelength band of 13-14 nm. The multilayer reflection film 12 was formed by alternately laminating Mo and Si on the substrate by DC magnetron sputtering. At first, using an Si target, an Si film was deposited to 4.2 nm under an Ar gas pressure of 0.1 Pa. Thereafter, using an Mo target, an Mo film was deposited to 2.8 nm under an Ar gas pressure of 0.1 Pa. The above-mentioned deposition is defined as a single period. After lamination of 40 periods, another Si film was finally deposited to 11 nm. The total film thickness was 291 nm. The multilayer reflection film thus formed had a stress of −550 MPa.

For the multilayer reflection film, a peak (i.e., maximum) reflectance at an incident angle of 5 degrees was 67%. The surface roughness on the multilayer reflection film was 0.15 nmRms.

In the above-mentioned manner, the substrate with the multilayer reflection film was obtained.

Figure 1B:
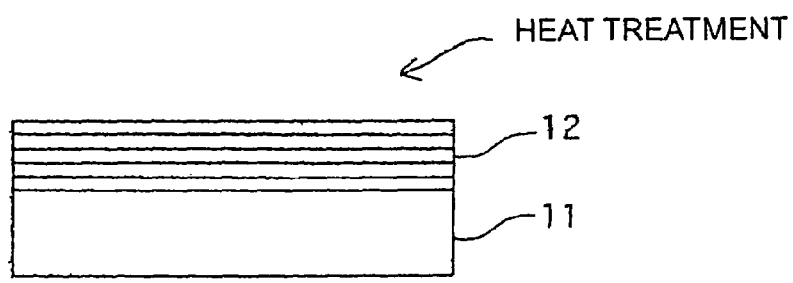

Next, the substrate with the multilayer reflection film thus obtained was subjected to heat treatment (see FIG. 1B).

The heat treatment was carried out on a hot plate at 90° C. in an air atmosphere. After three minutes of heating, the stress of the multilayer reflection film was substantially stabilized. However, with the intention of more sufficiently uniformly heating the multilayer reflection film, heating was carried out for 10 minutes.

After the heat treatment, the peak wavelength of the reflectance of the multilayer reflection film was 13.40 nm. The peak wavelength of the reflectance was measured by a method in which the EUV light is incident to the mask substrate at an incident angle of 5 degrees. By the use of the EUV light having a wavelength of 13.40 nm and an incident angle of 5 degrees, the reflectance was measured. As a result, the reflectance was 67% and was not changed at all as compared with that before the heat treatment.

Figure 2:
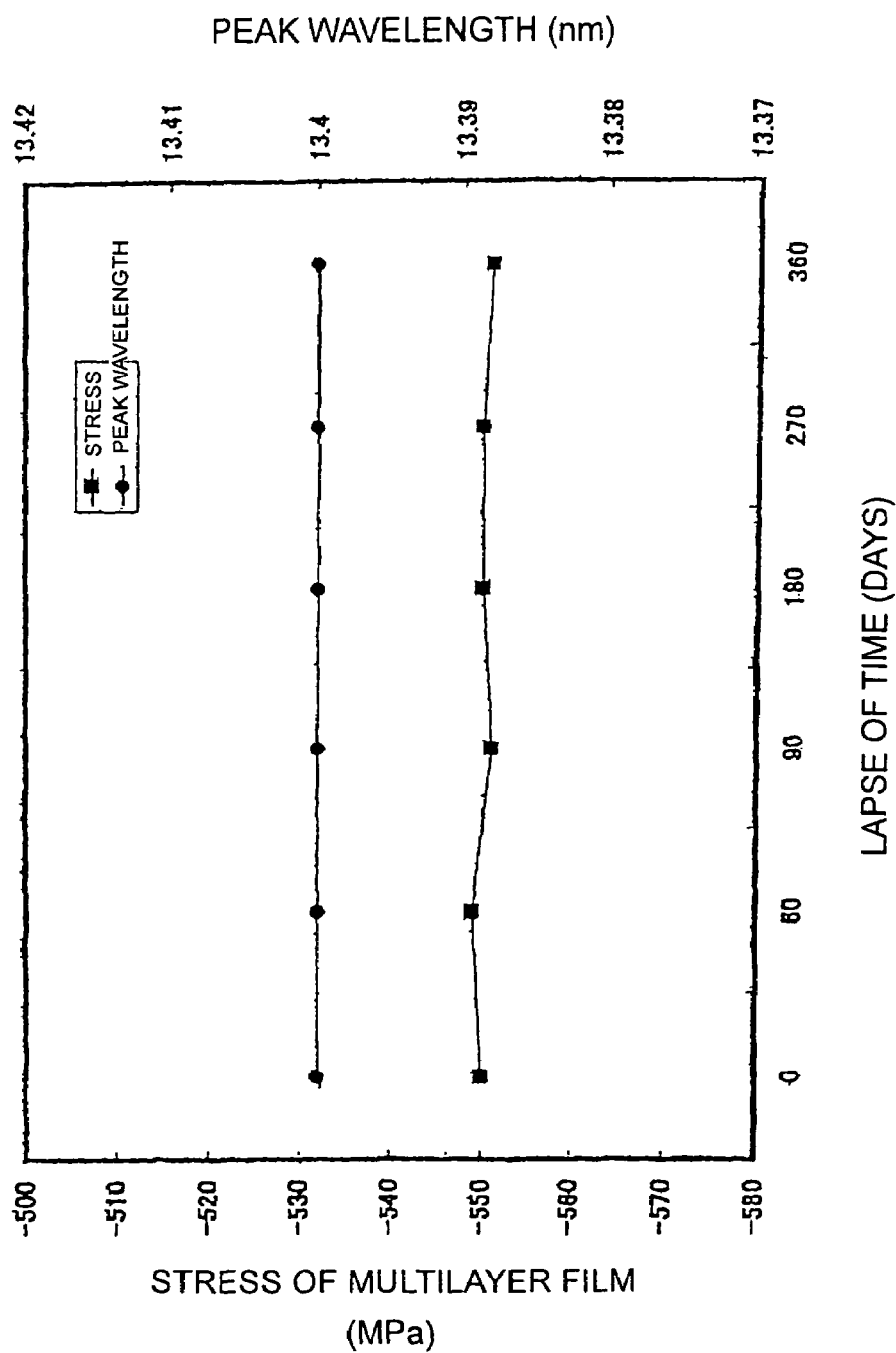
FIG. 2 is a graph showing the changes with time in stress and peak wavelength of a multilayer reflection film in an example of this invention.

For the substrate with the multilayer reflection film after the heat treatment, the changes with time in stress of the multilayer reflection film and in peak wavelength of the reflectance were measured. The result of measurement is shown in FIG. 2.

As regards measuring conditions, the above-mentioned substrate was left in air at the room temperature. After the lapse of a predetermined number of days, the stress of the multilayer reflection film and the peak wavelength were measured. As shown in FIG. 2, the substrate with the multilayer reflective film after the heat treatment exhibited no substantial changes in stress and in peak wavelength even after the lapse of one year and was stable without any substantial change with time.

Next, on the multilayer reflection film 12 of the substrate with the multilayer reflection film after the heat treatment, a chromium nitride (CrN) film as a buffer layer 13 was formed to the thickness of 30 nm. The deposition was carried out by DC magnetron sputtering using a Cr target and using nitrogen and Ar as a sputter gas. In the CrN film thus deposited, the composition ratio of Cr:N was 0.9:0.1 and the crystalline state was polycrystal. The film stress was +40 MPa as a value scaled to the film thickness of 50 nm.

Next, on the buffer layer 13 comprising the CrN film, an alloy (TaBN film) containing tantalum, boron, and nitrogen was formed as an absorber layer 14 to the thickness of 60 nm. The deposition was carried out by DC magnetron sputtering using a target containing Ta and B and using Ar with 10% nitrogen added thereto. At this time, by controlling the sputtering condition, the stress of the absorber layer 14 was adjusted to −50 MPa which is substantially equal in magnitude and reverse in direction to that of the chromium nitride film as the buffer layer. In the TaBN film thus deposited, Ta was 0.8, B was 0.1, and N was 0.1 as the composition ratio and the crystalline state was amorphous.

Figure 1C:
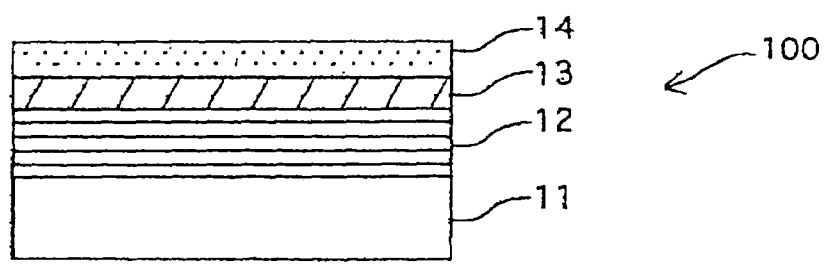

In the above-mentioned manner, the reflection type mask blank 100 in this example was obtained (see FIG. 1C).

Next, using the EUV reflection type mask blank 100, the EUV reflection type mask having a pattern for a 16 Gbit-DRAM of a 0.07 μm design rule was produced by a method which will be described in the following.

At first, on the above-mentioned EUV reflection type mask blank 100, a chemically amplified resist for electron beam writing was applied and baked at 135° C. to form a resist film. After electron beam writing, PEB and development were carried out to form a resist pattern.

Using the resist pattern as an etching mask, the EUV absorber layer 14 was dry etched with chlorine. Thus, an absorber layer pattern 14a was formed on the EUV reflection type mask blank.

Further, the resist pattern left on the absorber layer pattern 14a was removed by hot sulfuric acid at 100° C. Next, using a mixed gas of chlorine and oxygen, the buffer layer 13 was dry etched in accordance with the absorber layer pattern 14a to thereby form a patterned buffer layer 13a.

Figure 1D:
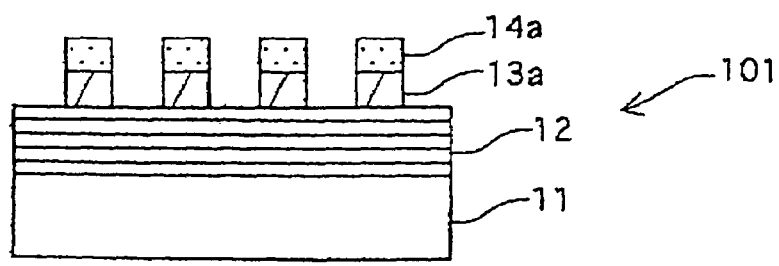

In the above-mentioned manner, the reflection type mask 101 in this example was obtained (see FIG. 1D).

Figure 3:
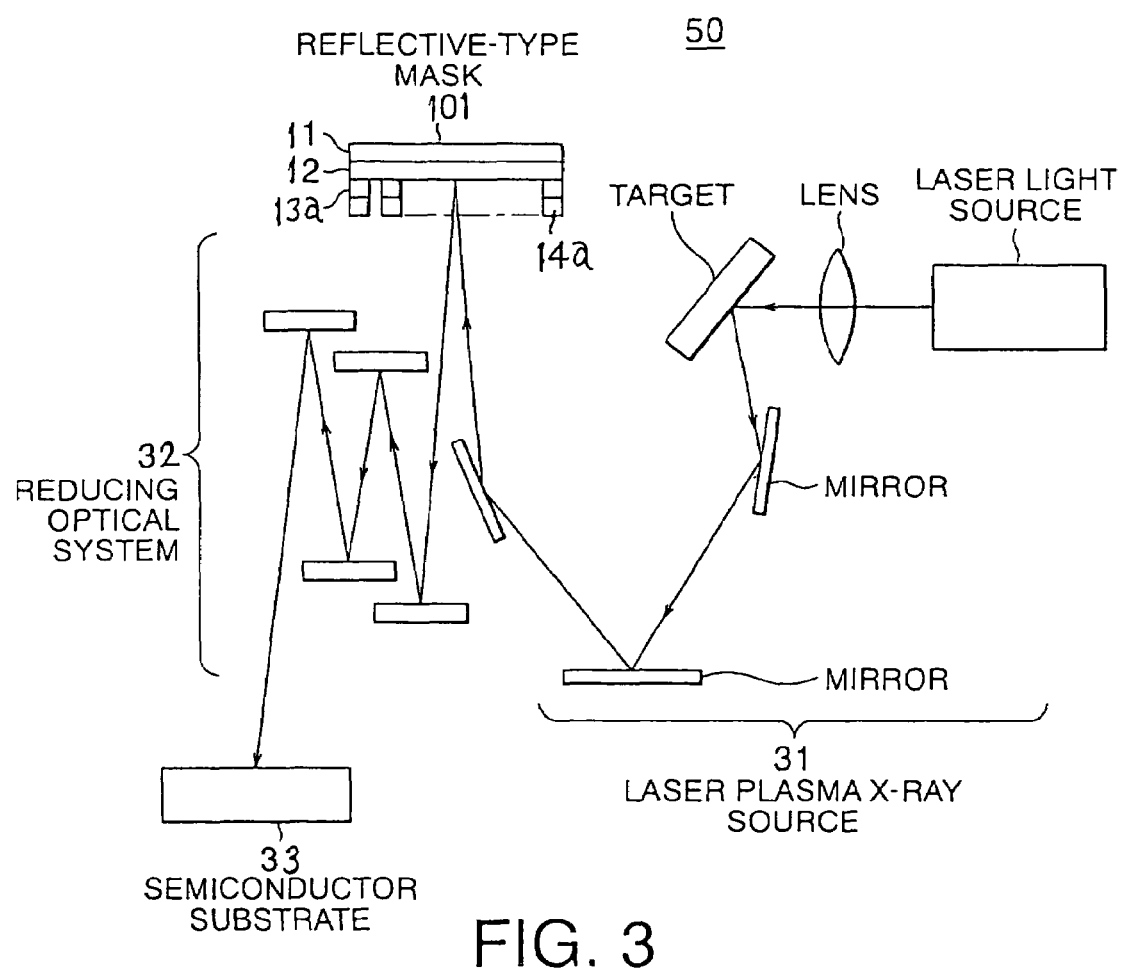
FIG. 3 is a view showing a general structure of a pattern transfer apparatus to which the reflection type mask illustrated in FIG. 1D is mounted.

Next referring to FIG. 3, description will be made of a method of transferring the pattern by the EUV light onto a semiconductor substrate 33 with a resist by the use of the reflection type mask 101. As illustrated in FIG. 3, a pattern transfer apparatus 50 with the reflection type mask 101 mounted thereto generally comprises a laser plasma X-ray source 31, the reflection type mask 101, a reducing optical system 32, and soon. The reducing optical system 32 comprises X-ray reflection mirrors. Through the reducing optical system 32, the pattern reflected by the reflection type mask 101 is typically reduced in scale to about ¼. Since the wavelength band of 13-14 nm is used as an exposure wavelength, adjustment was preliminarily made so that an optical path was positioned in vacuum.

In the above-mentioned state, the EUV light obtained from the laser plasma X-ray source 31 was made to be incident to the reflection type mask 101 and reflected as reflected light which was transferred via the reducing optical system 32 onto the semiconductor substrate (Si wafer) 33 with the resist.

In an area having the absorber layer pattern 14a, the light incident to the reflection type mask 101 was absorbed by the absorber layer without being reflected. On the other hand, the light incident to another area without the absorber layer pattern 14a was reflected by the multilayer reflection film 12. In this manner, an image formed by the light reflected from the reflection type mask 101 was incident to the reducing optical system 32. By the exposure light passing through the reducing optical system 32, a transfer pattern is generated by exposure on the resist layer on the semiconductor substrate 33. By developing the exposed resist, the resist pattern was formed. In the manner described above, the pattern was transferred onto the semiconductor substrate.

As a result, it was confirmed that the accuracy of the reflection type mask 101 was equal to or smaller than 16 nm as the required accuracy in the 70 nm design rule.

EXAMPLE 2

A reflection type mask blank was produced in the manner similar to Example 1 except that the heat treatment in Example 1 was carried out at 60° C. for 10 minutes.

The peak wavelength of a multilayer reflection film after the heat treatment was 13.38 nm. The reflectance of the multilayer reflection film after the heat treatment was 67%. Thus, no substantial decrease was observed as compared with the value before the heat treatment.

In the manner similar to Example 1, the changes with time in stress and in peak wavelength were measured for the substrate with the multilayer reflection film before formation of the buffer layer. As a result, no substantial change with time was observed.

Using the above-mentioned reflection type mask blank, an EUV reflection type mask having a pattern for a 16 Gbit-DRAM of a 0.07 μm design rule was produced in the manner similar to Example 1. Further, using the reflection type mask thus produced, pattern transfer onto the semiconductor substrate was carried out by the use of the pattern transfer apparatus in FIG. 3 in the manner similar to Example 1. As a result, it was confirmed that the accuracy of the reflection type mask in this example was equal to or smaller than 16 nm as the required accuracy in the 70 nm design rule.

EXAMPLE 3

A reflection type mask blank was produced in the manner similar to Example 1 except that the heat treatment in Example 1 was carried out for 15 minutes by contact with a hot sulfuric acid held at 90° C.

The peak wavelength of a multilayer reflection film after the heat treatment was 13.38 nm. The reflectance of the multilayer reflection film after the heat treatment was 67%. Thus, no substantial decrease was observed as compared with the value before the heat treatment.

In the manner similar to Example 1, the changes with time in stress and in peak wavelength were measured for the substrate with the multilayer reflection film before formation of the buffer layer. As a result, no substantial change with time was observed.

Using the above-mentioned reflection type mask blank, an EUV reflection type mask having a pattern for a 16 Gbit-DRAM of a 0.07 μm design rule was produced in the manner similar to Example 1. Further, using the reflection type mask thus produced, pattern transfer onto the semiconductor substrate was carried out by the use of the pattern transfer apparatus in FIG. 3 in the manner similar to Example 1. As a result, it was confirmed that the accuracy of the reflection type mask in this example was equal to or smaller than 16 nm as the required accuracy in the 70 nm design rule.

EXAMPLE 4

A reflection type mask blank was produced in the manner similar to Example 1 except that the heat treatment in Example 1 was carried out at 135° C. for 10 minutes.

The peak wavelength of a multilayer reflection film after the heat treatment was 13.39 nm. The reflectance of the multilayer reflection film after the heat treatment was 67%. The change occurred with respect to the peak wavelength of 13.40 nm and the reflectance of 67% before the heat treatment. As a result of the X-ray diffraction analysis, this is because mixing occurred at an interface between an Si film and an Mo film of the multilayer reflection film. In the manner similar to Example 1, the changes with time in stress and in peak wavelength were measured for the substrate with the multilayer reflection film before formation of the buffer layer. As a result, no substantial change with time was observed.

Using the above-mentioned reflection type mask blank, an EUV reflection type mask having a pattern for a 16 Gbit-DRAM of a 0.07 μm design rule was produced in the manner similar to Example 1. Further, using the reflection type mask thus produced, pattern transfer onto the semiconductor substrate was carried out by the use of the pattern transfer apparatus in FIG. 3 in the manner similar to Example 1. As a result, it was confirmed that the accuracy of the reflection type mask in this example was equal to or smaller than 16 nm as the required accuracy in the 70 nm design rule.

Next, description will be made of comparative examples with respect to the above-mentioned examples.

COMPARATIVE EXAMPLE 1

A reflection type mask blank in a comparative example was produced in the manner similar to Example 1 except that no heat treatment was carried out (the room temperature was kept) after a multilayer reflection film was formed on a substrate. In the manner similar to Example 1, the changes with time in stress and in peak wavelength were measured for the substrate with the multilayer reflection film in this comparative example before formation of the buffer layer. The result of measurement is shown in FIG. 4.

Figure 4:
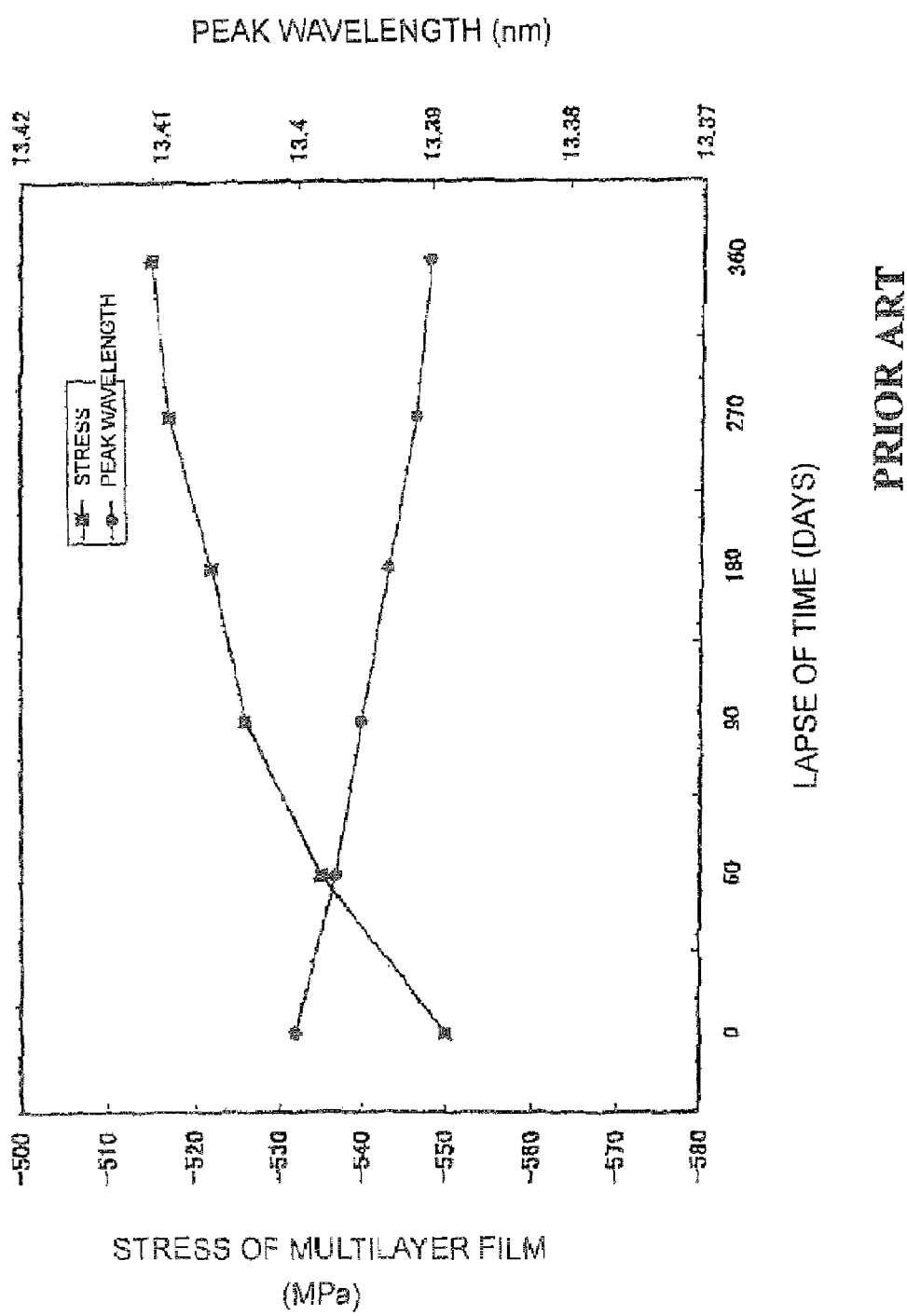
FIG. 4 is a graph showing the changes with time in stress and peak wavelength of a multilayer reflection film in a comparative example.

As illustrated in FIG. 4, the stress of the substrate with the multilayer reflection film in this comparative example was gradually changed with the lapse of time and was not stabilized even after the lapse of one year. It has been observed that, following the above-mentioned change, the peak wavelength was shifted for a long period of time. The reflectance after the lapse of one year was decreased by 0.5% as compared with the value immediately after the deposition.

COMPARATIVE EXAMPLE 2

A reflection type mask blank in another comparative example was produced in the manner similar to Example 1 except that the heat treatment was carried out at 200° C. for 15 minutes after a multilayer reflection film was formed on a substrate.

The peak wavelength of the reflectance of the multilayer reflection film after the heat treatment was 13.35 nm. The reflectance of the multilayer reflection film after the heat treatment was 66.3%. This is because considerable mixing occurred at an interface between an Si film and an Mo film of the multilayer reflection film so that a diffusion layer is increased. In pattern transfer using a reflection type mask, the change in peak wavelength and the decrease in reflectance mentioned above cause mismatching with reflection mirrors of the pattern transfer apparatus so that the exposure amount for the semiconductor substrate is changed. This affects the pattern resolution and means the variation in pattern size to be formed on the semiconductor substrate. Thus, this comparative example is not suitable as a reflection type mask blank.

In the foregoing examples, the heat treatment after deposition of the multilayer reflection film was described by way of example. However, the effect similar to that mentioned above is obtained in case where the heat treatment is carried out during deposition of the multilayer reflection film.

As described above in detail, in the method of producing a reflection type mask blank according to this invention, the multilayer reflection film formed on the substrate is subjected to the heat treatment at a heating temperature not higher than 100° C. to thereby suppress the change with time in stress of the multilayer reflection film after deposition thereof. As a consequence, it is possible to prevent the changes with time in wavelength characteristic and reflection characteristic of the multilayer reflection film with respect to the EUV light as the exposure light.

In this invention, the heating temperature is not lower than 50° C. and not higher than 100° C. This achieves the effect of sufficiently suppressing the change with time in stress. Since the heat treatment at a high temperature is not required, it is possible to prevent the decrease in reflectance of the multilayer reflection film and the substantial shift in peak wavelength.

The heat treatment may be carried out by keeping the multilayer reflection film formed on the substrate in contact with the liquid held in a heated state. For example, the substrate is dipped in a cleaning liquid held in a heated state to be kept in contact therewith for a predetermined time period. In this manner, the heat treatment of this invention can be carried out simultaneously with cleaning without adding a new step.

By the use of a multilayer film obtained by alternately laminating, for example, molybdenum thin films and silicon thin films to form a multilayer reflection film, a high reflectance for the EUV light of 13-14 nm is achieved. By carrying out the heat treatment according to this invention, it is possible to suppress the change with time of the multilayer reflection film.

By forming a pattern in the absorber layer of the reflection type mask blank produced by the method of this invention, it is possible to obtain a reflection type mask which is suppressed in change with time in stress of the multilayer reflection film and which can stably be used in practical use.

What is claimed is:

1. A method of producing a reflection mask blank by forming, on a substrate, at least a multilayer reflection film for reflecting exposure light and an absorber layer formed on said multilayer reflection film for absorbing the exposure light, said method comprising:

a first measuring step of measuring a peak reflectance of the multilayer reflection film and a peak wavelength of the reflectance of the multilayer reflection film after the multilayer reflection film is formed on the substrate;

a step of carrying out a heat treatment for said substrate with the multilayer reflection film at a substrate heating temperature of said substrate with the multilayer reflection film which temperature is not lower than 50° C. and not higher than a baking temperature of a resist film;

a second measuring step of measuring a peak reflectance of the multilayer reflection film and a peak wavelength of the reflectance of the multilayer reflection film after the heat treatment is carried out for said substrate with the multilayer reflection film; and a step of checking whether change in peak wavelength and decrease in peak reflectance due to differences between the peak wavelengths and between the peak reflectances measured in the first and the second measuring steps do not cause mismatching with reflection mirrors of a pattern transfer apparatus using a reflection mask produced from the reflection mask blank and do not thereby cause variation in size of a pattern formed on a semiconductor substrate by the use of the reflection mask.

2. A method of producing a reflection mask blank as claimed in claim 1, wherein the heat treatment is carried out by keeping said multilayer reflection film formed on said substrate in contact with a liquid held in a heated state.

3. A method of producing a reflection mask blank as claimed in claim 2, wherein the liquid is a cleaning liquid, the heat treatment being carried out simultaneously with cleaning using the cleaning liquid.

4. A method of producing a reflection mask blank as claimed in claim 1, wherein said resist film is a chemically amplified resist formed on the multilayer reflection film.

5. A method of producing a reflection mask blank as claimed in claim 1, wherein a substrate heating temperature of said substrate with the multilayer reflection film in the heat treatment is not lower than 50° C. and not higher than 135° C., the heat treatment being carried out for a time period equal to 3 minutes or more.

6. A method of producing a reflection mask, comprising a step of forming a pattern in said absorber layer of the reflection mask blank produced by the method of producing a reflection mask blank claimed in claim 2.

7. A method of producing a semiconductor device, comprising a step of forming a fine pattern on a semiconductor substrate by lithography using said reflection mask produced by the method of producing a reflection mask claimed in claim 6.

* * * * *